United States Patent [19]

Usui et al.

[11] Patent Number: 5,943,601
[45] Date of Patent: Aug. 24, 1999

[54] PROCESS FOR FABRICATING A METALLIZATION STRUCTURE

[75] Inventors: Takamasa Usui, Kanagawa-ken, Japan; Patrick W. DeHaven, Poughkeepsie, N.Y.; Kenneth P. Rodbell, Poughquag, N.Y.; Ronald G. Filippi, Wappingers Falls, N.Y.; Chi-Hua Yang, Yorktown, N.Y.; Tomio Katata, Kanagawa-ken, Japan; Hideaki Aochi, Wappingers Falls, N.Y.

[73] Assignee: International Business Machines Corporation, Armonk, N.Y.

[21] Appl. No.: 08/846,382

[22] Filed: Apr. 30, 1997

[51] Int. Cl.$^6$ .................................................. H01L 21/44
[52] U.S. Cl. ........................................ 438/688; 438/680
[58] Field of Search ..................................... 438/624, 641, 438/675, 655, 592, 643, 644, 653, 606, 975, 680, 688

[56] References Cited

U.S. PATENT DOCUMENTS

| | | | |
|---|---|---|---|
| 4,438,450 | 3/1984 | Sheng et al. | 357/68 |
| 4,910,580 | 3/1990 | Kuecher et al. | 357/71 |
| 5,071,714 | 12/1991 | Rodbell et al. | 428/620 |
| 5,242,860 | 9/1993 | Nulman et al. | 437/190 |
| 5,345,108 | 9/1994 | Kikkawa | 257/751 |
| 5,360,996 | 11/1994 | Nulman et al. | 257/767 |
| 5,373,192 | 12/1994 | Eguchi | 257/774 |
| 5,380,678 | 1/1995 | Yu et al. | 437/190 |
| 5,420,072 | 5/1995 | Fiordalice et al. | 437/192 |
| 5,449,641 | 9/1995 | Maeda | 437/195 |
| 5,523,259 | 6/1996 | Merchant et al. | 437/190 |
| 5,525,199 | 6/1996 | Scobey | 204/192.26 |
| 5,532,509 | 7/1996 | D'Addeo | 257/618 |
| 5,552,339 | 9/1996 | Hsieh | 438/643 |
| 5,565,708 | 10/1996 | Ohsaki et al. | 257/764 |
| 5,580,823 | 12/1996 | Hegde et al. | 437/192 |
| 5,584,973 | 12/1996 | Wada et al. | 204/192.12 |
| 5,587,339 | 12/1996 | Wyborn et al. | 437/195 |
| 5,627,102 | 5/1997 | Shinriki et al. | 437/192 |
| 5,635,763 | 6/1997 | Inoue et al. | 257/763 |
| 5,641,992 | 6/1997 | Lee et al. | 257/762 |
| 5,641,994 | 6/1997 | Bollinger et al. | 257/771 |
| 5,675,186 | 10/1997 | Shen et al. | 257/751 |
| 5,738,961 | 4/1998 | Chen | 430/22 |

FOREIGN PATENT DOCUMENTS

717436-A2  6/1996  European Pat. Off. .

OTHER PUBLICATIONS

Knorr et al, "Correlation of Texture with Electromigration Behavior in Al Metallization", *Appl. Phys. Lett.*, 59 (25), Dec. 16, 1991, pp. 3241–3243.

Tracy et al, "Texture in Multilayer Metallization Structures", *J. Appl. Phys.*, 76 (5), Sep. 1, 1994, pp. 2671–2680.

Rodbell et al, "Texture Effects on the Electromigration Behavior of Layered Ti/AlCu/Ti Films", *Mat. Res. Soc. Symp. Proc.*, vol. 265, 1992, pp. 107–112.

*Primary Examiner*—Charles Bowers
*Assistant Examiner*—Reneé R. Berry
*Attorney, Agent, or Firm*—Pollock, Vande Sande & Amernick

[57] ABSTRACT

A metallization structure is fabricated by depositing an underlayer of a group IVA metal having a thickness of about 90 to about 110 angstroms, and depositing a layer of aluminum and/or an aluminum alloy. The metallization structure obtained exhibits enhanced electromigration and is highly textured and is especially suitable for forming electrical connections or wiring.

22 Claims, 7 Drawing Sheets

PROCESS FOR FABRICATING A METALLIZATION STRUCTURE

TECHNICAL FIELD

The present invention is concerned with a method for fabricating a metallization structure and is especially concerned with producing a structure having an aluminum and/or aluminum alloy layer that exhibits enhanced electromigration characteristics. Moreover, the process of the present invention provides highly textured aluminum <111> layers. The structures fabricated by the process of the present invention are especially useful for forming electrical connections or wiring such as between active and/or passive devices of an integrated circuit structure.

BACKGROUND ART

Aluminum and aluminum alloys are used for forming various electrical connections or wiring in electronic devices such as in integrated circuit structures. The aluminum or aluminum alloys are used for forming the electrical connections between active and/or passive devices of the integrated circuit structure. It has been the practice to use aluminum or an alloy electrically connected to an underlying substrate such as silicon. While the aluminum and silicon are electrically connected together, it has become the practice to use intermediate electrically conductive layers interposed between the silicon and aluminum to provide better electrical connection to the silicon, and to provide a physical (metallurgical) barrier between the silicon and aluminum. This is for the purpose of preventing electromigration and spiking of the aluminum into the silicon. Migration of aluminum atoms into the underlying silicon can interfere with the performance and reliability of the resulting integrated circuit structure.

In addition to electromigration, the problem of hillock growth also occurs. These problems are especially pronounced at the submicron level. As the demand increases for scaling down the dimensions of the interconnection lines and for increasing the current density, overcoming, or at least minimizing, electromigration and hillock growth is essential.

In an attempt to overcome the problems experienced with pure aluminum, aluminum has been alloyed with for instance copper. However, relatively high percentage aluminum-copper (>2%) is known to be difficult to dry etch and corrodes relatively easily.

In an effort to improve on the use of aluminum-copper as the interconnection metallurgy, aluminum-copper has been taught to be layered with a refractory metal such as in U.S. Pat. No. 4,017,890. This patent suggests a method and resulting structure for forming narrow intermetallic strips which carry high currents on bodies such as semiconductors and integrated circuits, wherein the conductive strip includes aluminum or aluminum-copper with at least one transition metal. While the aluminum-copper and transition metal structure improves the electromigration problems associated with aluminum-copper, the problems of etching and corrosion, as well as, the complete elimination of hillocks have not been solved.

With respect to hillocks, such result from the large differences between the thermal expansion coefficients of the metal interconnect lines and the substrate. To eliminate and minimize hillock formation, it has been suggested to use a multi-layered structure instead of a single layer of the interconnect metallurgy. An effective reduction in hillock formation has been achieved by using a multi-layered structure of aluminum or aluminum intermetallic with a layer of a refractory metal. A typical interconnect metallurgy structure includes a layered structure of aluminum silicon compound onto which there has been deposited a layer of a refractory metal, such as, titanium (see "Homogenous and Layered Films of Aluminum/ Silicon with Titanium for Multi-Level Interconnects", 1988, IEEE, V-MIC Conference, Jun. 25–26, 1985).

There have also been refinements to this layered metal structure to provide a lower resistivity, hillock-free, interconnect metallurgy. These refinements include incorporating a barrier metal of, for example, titanium tungsten or titanium nitride under the aluminum silicon to prevent contact spiking and prevent forming ternary compounds in the aluminum silicon alloy (see "Multi-Layered Interconnections for VLSI", MRS Symposia Proceedings, Fall 1987). Moreover, there have been other proposed device interconnect structures to reduce resistivity and provide a more planar and defect free interconnect structure. For instance, IBM Technical Disclosure Bulletin, Vol. 21, April 11, 1979, pp. 4527–4528, teaches the enhancement of the metallurgy for the interconnection due to sputtered deposition. Furthermore, the feature of using a capping layer to improve performance has been disclosed in IBM TDB, Vol. 17, No. 1A, 1984 and TDB, Vol. 21, July 2, 1978.

In addition, U.S. Pat. No. 5,071,714 discloses a structure that includes a low weight copper content aluminum-copper conductor exhibiting superior electromigration characteristics along with being hillock free, dry etchable and corrosion resistant. Moreover, the structures disclosed therein are of relatively low resistivity.

However, there still remains room for improvement of the electromigration characteristics. Accordingly, an objective of the present invention is to provide a structure that exhibits enhanced electromigration performance along with being hillock free and without a concomitant loss in the dry etchability characteristic and corrosion resistant characteristic of the structure.

SUMMARY OF THE INVENTION

The present invention is concerned with a process for fabricating a metallization structure. In particular, the process of the present invention comprises the steps of:

a) depositing onto a substrate a first layer of titanium having a thickness of about 90 to about 110 angstroms; and then (b) depositing a layer of aluminum and/or an aluminum alloy whereby the layer of aluminum and/or aluminum alloy is in electrical contact with the layer of the group IVA metal. The process of the present invention provides a metallization structure that exhibits enhanced electromigration characteristics along with being highly textured and being free of hillocks. Moreover, the metallization structure produced by the method of the present invention exhibits relatively low resistivity and is relatively easy to fabricate.

Still other objects and advantages of the present invention will become apparent to those skilled in the art from the following detailed description, wherein, it is shown and described only the preferred embodiments of the invention simply by way of illustration of the best mode contemplated of carrying out the invention. As will be realized, the invention is capable of other and different embodiments, and its several details are capable of modifications in various obvious respects, without departing from the invention. Accordingly, this description is to be regarded as illustrative in nature and not as restrictive.

BEST AND VARIOUS MODES FOR CARRYING OUT INVENTION

Figure 1:
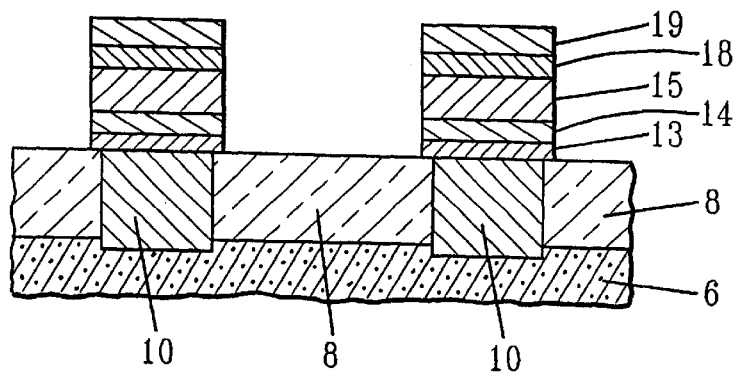
FIG. 1 is a cross-sectional view of a preferred embodiment of an interconnect metallurgy according to the present invention.

FIG. 1 is a cross-sectional view of the preferred embodiment of an interconnect metallurgy structure according to the present invention. Referring to FIG. 1, the interconnect metallurgy preferably comprises a 4 or 5 layer structure over an interplanar stud connection 10 surrounded by an insulator 8 to make connection to a device substrate 6. The metallurgy structure includes an underlayer of a group IVA metal and preferably a layer of titanium. Critical to the success of the present invention is having the thickness of this underlayer 13 being between about 90 angstroms to about 110 angstroms. As will be demonstrated hereinbelow, by limiting the thickness of this underlayer 13, the structure and texture of the subsequently to be applied metallic layers is carefully controlled. This is essential in achieving the necessary properties of the structure of the present invention.

In addition, central to the metallization structure of the present invention is a layer 15 that is in electrical contact with underlayer 13. Layer 15 is aluminum or an aluminum alloy. Typical aluminum alloys include alloying metal such as copper, magnesium, silicon, lanthanides such as vanadium and yttrium; and palladium. Preferably, the amount of alloying metal when present is up to about 3 percent by weight of the alloy and most preferably is about 0.5 to about 1 percent by weight. If desired, a mixture of the alloying metals can be employed. The preferred alloying metal is copper. This layer 15 typically has a thickness of about 2000 to about 6000 angstroms and more typically about 2000 to about 2500 angstroms. The aluminum or aluminum alloy layer is a highly <111> textured layer. Highly textured refers to a half-width on an intensity verses chi scan (referred to hereinafter as (ω95) of less than 15 degrees and a small volume fraction (e.g. <20 percent) of random grains. This textured structure is significant in achieving the greatly improved electromigration performance obtained pursuant to the present invention.

Although not required, it is preferred that a titanium nitride layer 14 be located intermediate the group IVA layer 13 and the aluminum or aluminum alloy layer 15. This titanium nitride layer that is located above and in contact with the underlayer 13 prevents reaction between the aluminum layer 15 and underlayer 13. Typically this layer 14 has a thickness of about 50 to about 500 angstroms and preferably about 50 to about 150 angstroms.

Also, although not required, according to preferred aspects of the present invention a capping layer is provided above layer 15. The capping layer when present, enhances the lithographic processing since it acts as an anti-reflective layer aiding in controlling line width. Preferred capping layers are titanium nitride and combinations of as layer 18 of a group IVA metal, preferably titanium with a titanium nitride layer 19. Typically the titanium nitride layer is about 150 to about 800 angstroms and more typically about 200 to about 500 angstroms. Typically, the titanium layer is about 50 angstroms to about 200 angstroms.

While this completes the structure for a single interconnect layer according to the present invention, it should be recognized by those skilled in the art that these layers can then be repeated in a multiple level sequence to complete the interconnect circuit for the devices.

The various layers can be provided by chemical vapor deposition (CVD) techniques or by physical vapor deposition (PVD) techniques such as evaporation and sputtering. The preferred method is sputter deposition and the most preferred technique, as will be discussed below, involves sputtering by collimation or "long throw".

The criticality of employing an underlayer of the group IVA metal having a thickness of 90 angstroms to 110 angstroms is demonstrated by Table 1 below.

TABLE 1

Effect of Ti Underlayer Thickness on Texture of Al-0.5Cu Films

| Ti Thickness in Å | Volume Fraction Random | ω95 in degrees |
|---|---|---|
| 250 | 0.33 | 12.2 |
| 125 | 0.23 | 9.4 |
| 100 | 0.17 | 9.4 |
| 75 | 0.26 | 10.4 |

Table 1 summarizes texture data obtained on a series of aluminum—0.5 percent by weight copper films which had the structure:

xTi/5200ÅAl(Cu)/300ÅTiN, wherein x represents the thickness of the Ti underlayer. In this table, the optimum Al<111> texture is that which has the lowest volume fraction of random component and the narrowest width of the <111> diffraction peak (in this case measured by ω95 which represents the width of the diffraction peak which contains 95% of the peak intensity). It is abundantly clear from Table 1 that the optimum texture is produced by a 100 angstroms Ti underlayer. The electromigration data is also improved for the 100 angstroms thick titanium underlayer.

Figure 9:
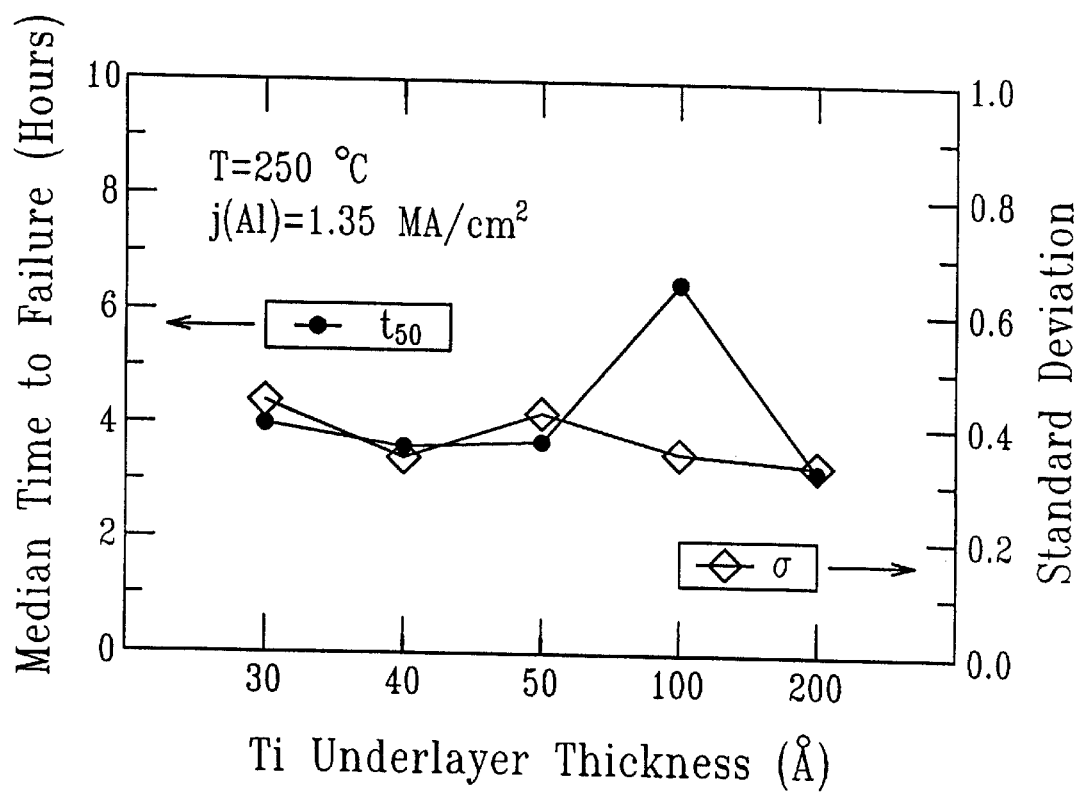
FIG. 9 and FIG. 10 are graphs illustrating the time to failure depending upon the thickness of the underlayer.
Figure 10:
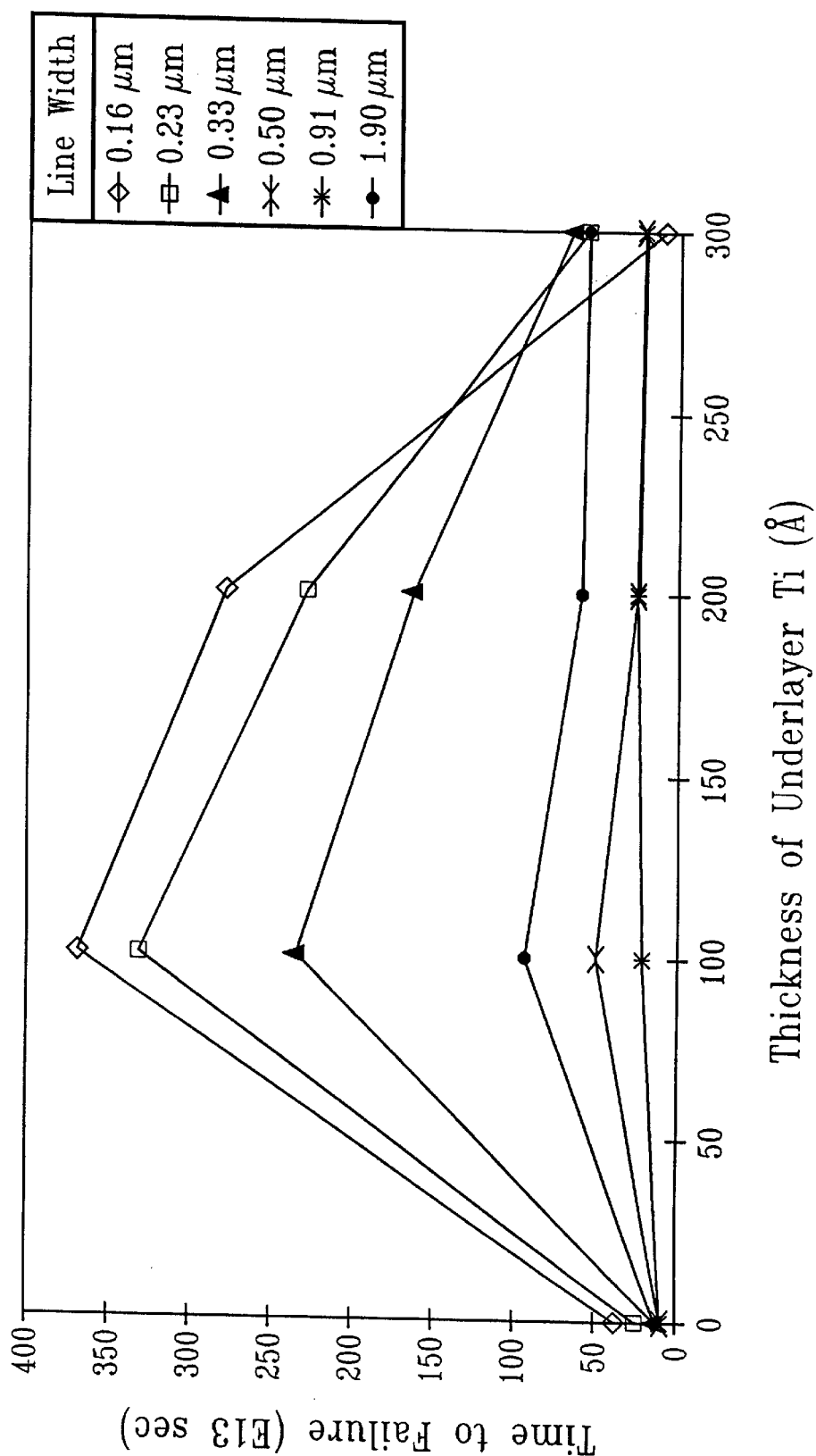

FIGS. 9 and 10 are graphs illustrating failure tests carried out on the following metal stack of:

xÅTi/100ÅTiN/2300ÅAl(0.5% Cu)/50ÅTi/400ÅTiN, wherein x is the thickness of the titanium underlayer.

FIG. 9 is a graph showing conventional electromigration test data at 250° C. and 1.35 MA/cm$^2$. FIG. 9 shows, on the left hand y axis, the time to failure in hours, on the right hand y axis, the standard deviation of the log normal distribution, and on the x axis, the thickness x of the titanium underlayer. The data shows the significant improvement in time to failure when using the 100 angstrom thick underlayer. In particular, time to failure for the 30, 40 and 50 angstroms thick film was about four hours, for the 200 angstroms thick film was about three hours, as contrasted to the 100 angstroms thick underlayer which was about seven hours. The standard deviations of the log normal distribution was about the same (~0.35–0.4) for all of the underlayers.

FIG. 10 is a graph showing projected lifetimes from an isothermal wafer level electromigration test. FIG. 10 shows on the y axis, time to failure in E 13 sec. verses the thickness of the underlayer on the x axis for various line widths, and shows the improvement in time to failure when using the 100 angstrom thick underlayer, with the improvement becoming more pronounced and significant as the line width decreases and especially at about 0.33 microns and below.

Figure 2:
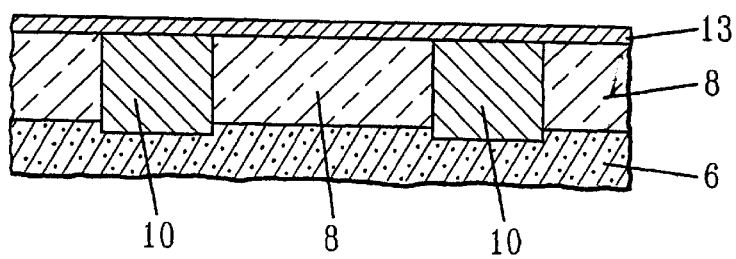
FIGS. 2–8 are a cross-sectional view of the process for fabricating the preferred interconnect metallurgy of the present invention in a step-by-step fashion.

Referring now to FIG. 2, FIG. 2 shows a planar insulator 8 and contact stud 10 with a group IVA metal layer 13 sputter deposited thereon. The layer 13 is deposited by the following process. After formation of the device contact metallization 10, the semiconductor wafer 6 would be loaded into a sputtering tool which has been pumped to a low pressure. An in-situ sputter clean is then performed to remove any oxide from the contact metal 10 formed on the wafer at this time. This in-situ sputter clean typically is a mild sputter clean, run, for example, at about 5 minutes at low power (approximately 1000 watt) in a high-pressure argon ambient.

Following the sputter cleaning, the first layer of metallization 13 is then deposited. This first level metallization 13 is a group IVA metal and preferably titanium, deposited on the device contact metallization 10 of the wafer in a blanket formation. This layer 13 is deposited at low power in a high pressure, high purity, argon plasma preferably from an ultra-pure titanium target. The titanium is typically sputtered at a temperature of about 150° C. to about 450° C. The wafer is usually at a temperature of room temperature up to about 300° C. during the sputtering process. The titanium is deposited to a thickness of about 90 to about 110 angstroms and most preferably at about 100 angstroms.

Figure 3:
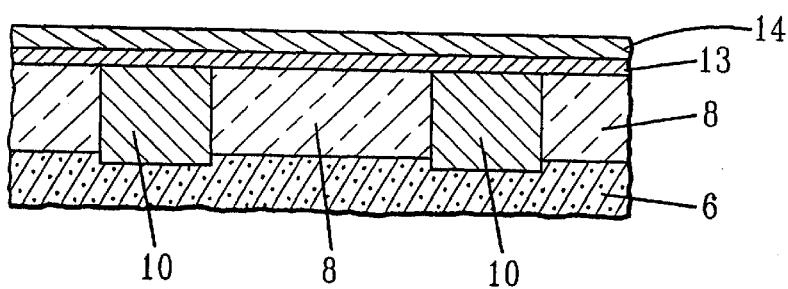

Referring now to FIG. 3, following the deposition of the layer 13, a titanium nitride layer 14 is formed by sputter deposition of titanium nitride to the desired thickness. Titanium nitride layer 14 may be formed in the same chamber used for deposition of the titanium layer 13 or in a different apparatus.

Figure 4:
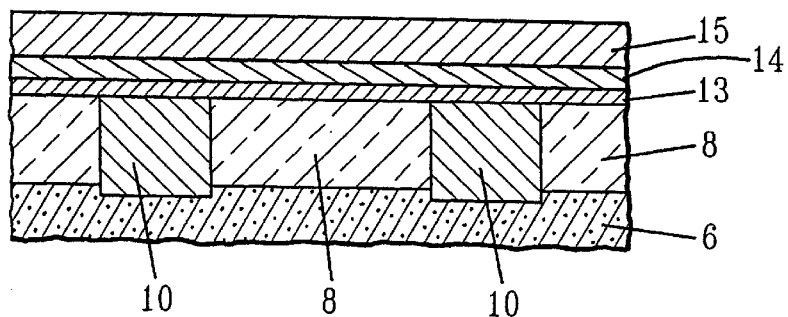

Referring to FIG. 4, following the deposition of the layer 14, the interconnect metallization layer 15 is next blanket deposited. The interconnect metallization 15 is aluminum or an aluminum alloy and preferably an aluminum—0.5 weight percent copper. The aluminum-copper is deposited at high power using a direct current magnetron in a high purity argon plasma from an ultra-pure pre-alloy target typically aluminum—0.5 weight percent copper with a deposition rate of about 1 micron per minute.

Figure 5:
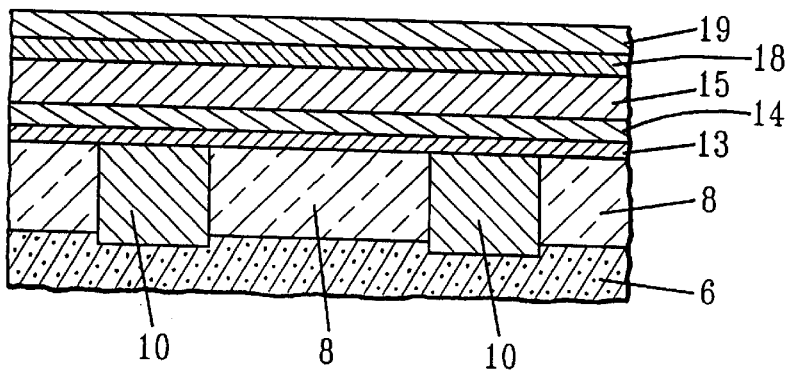

Onto the aluminum-copper interconnect metallization 15 is then deposited about 50 to about 250 angstroms of a group IVA metal, preferably titanium, as layer 18 similar to the previously deposited metal layer 13 discussed above. Deposition and composition of layer 18 can be carried out in the same way as for layer 13. From FIG. 5, onto the metal layer 18 is then blanket deposited the suitable capping layer 19 to complete the interconnect metallurgy at this level. The capping layer is preferably titanium nitride and can be deposited in the same manner as the titanium nitride layer 14. The purpose of this layer is to limit the amount of light reflection during the subsequent photoresist steps and to act as a protective layer against corrosion during subsequent processing. Therefore, any layer which would similarly satisfy the requirements of reducing the amount of light reflection and provide protective anodic capping during subsequent processing would be usable for this layer.

Figure 6:
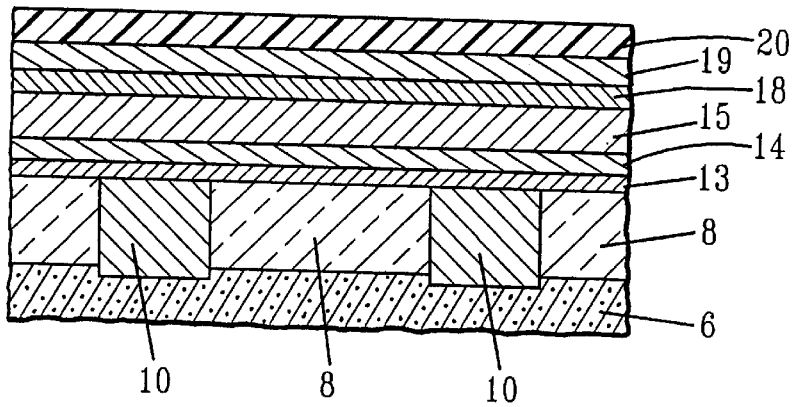
Figure 7:
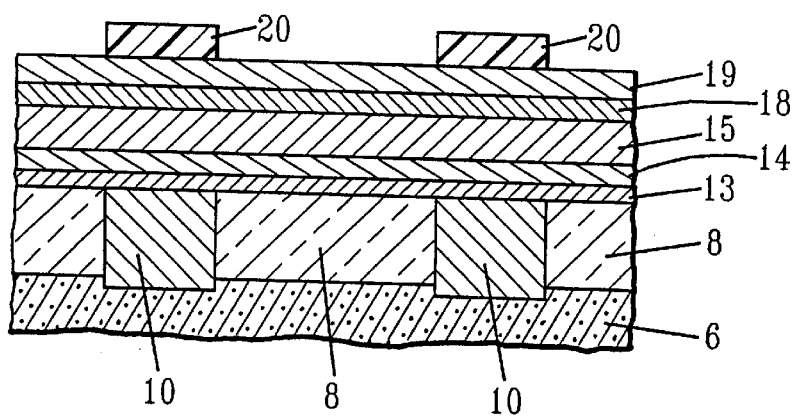

Referring now to FIGS. 6 and 7, on top of metallization 19, a photoresist 20 is then applied to pattern this blanket interconnect metallization. Any number of different photoresist techniques can be used. Although a single layer resist is shown, it is understood that multi-layer photoresists can be used if desired. The photoresist can be delineated and developed by well-known lithographic means to provide a lithographic mask for the subsequent reactive ion etching of the underlying blanket metal layers. Such are well known to those skilled in the art and need not be disclosed herein in any further detail.

Figure 8:
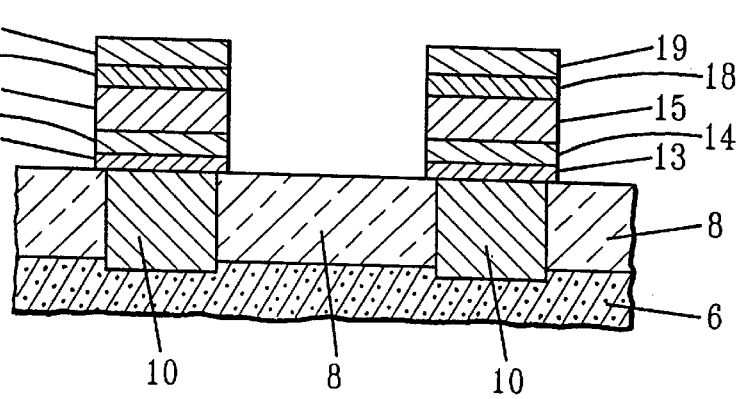

Referring now to FIG. 8, the metallurgy can now be reactively ion etched in a multi-step sequence. The first step is to break through any oxides which may exist on the top surface of the metallization. Next, most of the metal is removed by reactive ion etching. An over etch is, then, performed to ensure that all of the metal in the previous step has been etched away.

The reactive ion etch is typically performed in a single wafer tool under a low pressure. Typically plasma composition, pressure, power and time combinations, for performing the above etches in a step-by-step process are well known to those skilled in the art and need not be described in any detail herein.

The remaining resist 20 can be removed by any well known technique such as by placing the wafer in an oxygen plasma.

With removal of the remaining layer resist 20, the metallization stack can now be annealed by placing the wafer in an oven at about 400 to about 450° C. in forming gas or an inert gas such as argon for about 30 minutes to about 45 minutes in order to grow the grain size of the textured aluminum layer and to cause reaction between titanium and aluminum layers, if adjacent, that are in contact with each other to thereby form $TiAl_3$.

According to preferred aspects of the present invention, at least the titanium and, when employed, titanium nitride layers are coherently deposited by collimation or "long throw" in order to achieve optimum electromigration performance. Structures prepared with a collimated or long throw deposition for the titanium and, if present, titanium nitride layers demonstrate a significantly improved electromigration performance as compared to those deposited with a non-collimated deposition technique. A typical apparatus suitable for providing a collimated deposition technique can be found in U.S. Pat. No. 5,580,823 to Hegde et al and U.S. Pat. No. 5,584,973 to Wada et al, disclosures of which are incorporated herein by reference. In a typical collimator, baffles or parallel plates are present to ensure that improperly focused sputtered material from the target do not reach the wafer but instead deposit on the baffles.

Figure 13A:
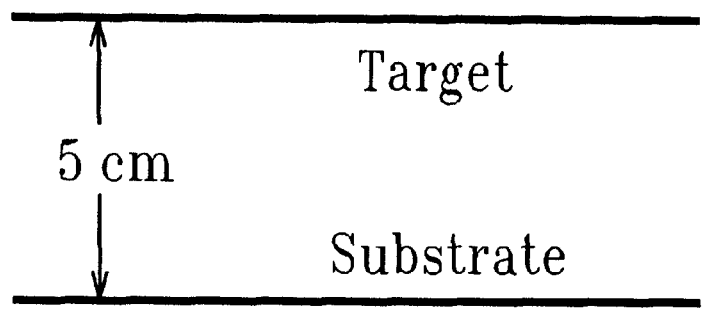
FIG. 13A and FIG. 13B are schematic diagrams of PVD sputtering geometries.

FIG. 13A shows a typical distance of about 5 cm from the target to substrate in a PVD non-collimated sputtering chamber.

Figure 13B:
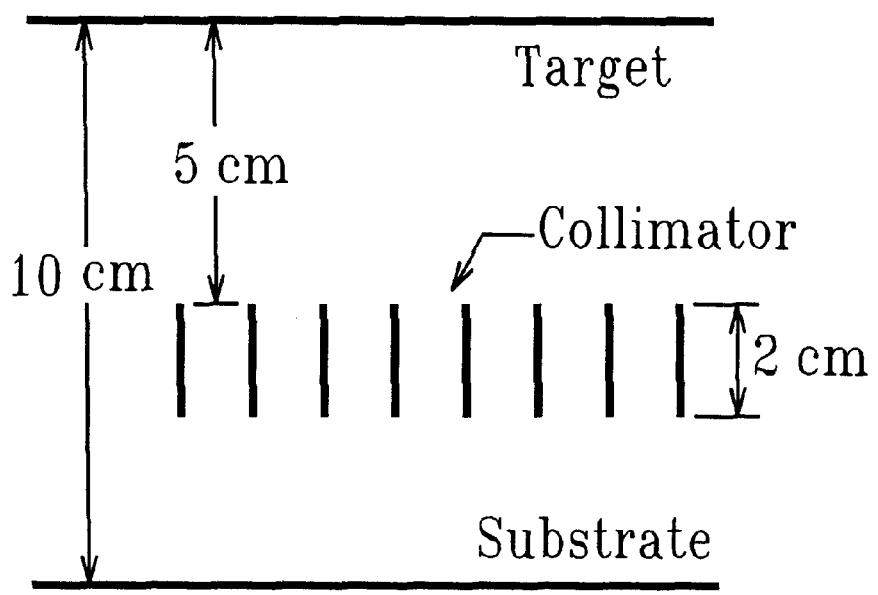

FIG. 13B shows typical geometries for a PVD sputtering chamber with a collimator. The distance between the target and substrate is about 10 cm, the distance between the target and collimator is about 5 cm and the collimator is about 2 cm in height. The collimator is spaced about 3 cm from the substrate.

In a long throw technique, the distance between the sputtering target and the wafer is about 2 to 3 times longer than in a non-collimated deposition process and is typically about 20 centimeters long. In addition, it is desired to include a shutter in the sputtering apparatus to assure high purity titanium film being deposited. This is especially important for the top titanium layer, which needs to be of the highest purity in order to maximize the electromigration performance.

A typical long throw deposition apparatus is available under the trade designation Ulvac.

The following electromigration tests were carried out comparing non-collimated deposition to the preferred deposition techniques of the present invention. In particular, a metal film stack of 100ÅTi/100ÅTiN/2300ÅAl(0.5%Cu)/50ÅTi/400ÅTiN was employed. The first group of wafers was deposited in an Endura PVD metal sputtering tool, whereby the deposition of the Ti/TiN film is performed in a non-collimated chamber. The second group of wafers was deposited in an Ulvac metal sputtering tool. The Ti and TiN films in the Ulvac tool are performed in a long throw chamber, in which the distance between the sputtering target and the wafer is three times longer than that in the Endura non-collimated chamber. Moreover, the Ti/TiN chamber in the Ulvac tool has a shutter. This shutter provides for much higher purity of the Ti film to be deposited by using the shutter to remove the nitration accumulated on the target by previous wafers. In the long throw and collimated chamber, titanium is deposited on the side walls or collimator, respectively. This deposited titanium serves as a pump and reacts with contaminants such as oxygen whereby, for instance, the oxygen is gettered into the freshly deposited titanium. In the Endura Ti/TiN case, the target was nitrated due to the prior TiN deposition.

Figure 11:
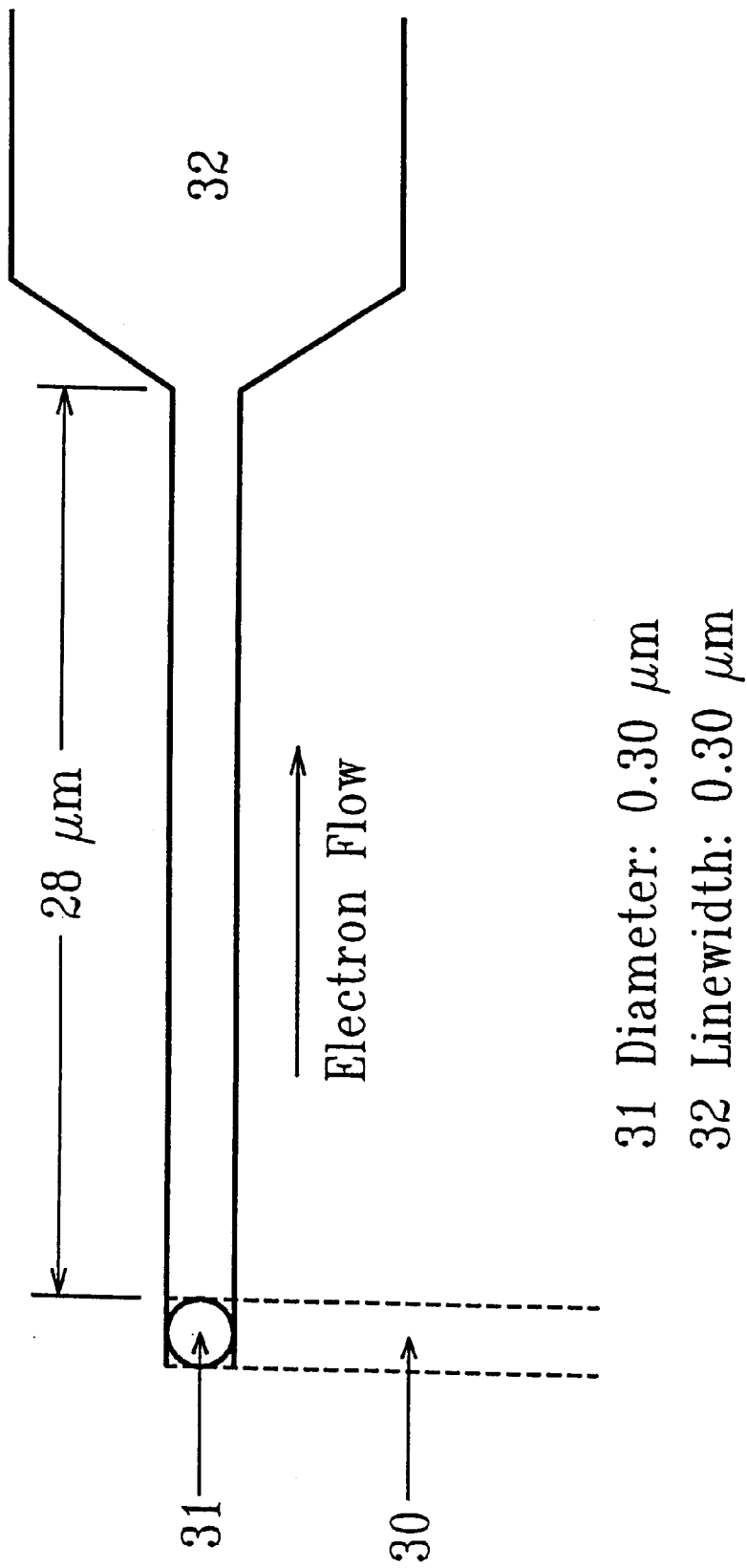
FIG. 11 is a schematic diagram of a structure subjected to the processing suitable for forming the structures of the present invention.

Three wafers from each lot were tested for electromigration at 0.81 mA and 250° C. The current density in the metal line was about 0.9 MA/cm$^2$. The tests were performed on the structure illustrated in FIG. 11. In FIG. 11, number 30 represents underlying metal level, 31 represents vias between metal level 30 and upper metal level 32. Upper metal level 32 contains the above disclosed metal film stack. The via 31 diameter is about 0.30 microns and the line width for metal level 32 is about 0.30 microns. The median time to failure (t50), and shape parameter of the log normal distribution, sigma ($\sigma$), are as follows:

Endura: t50=8.1 hrs, $\sigma$=0.52

Ulvac: t50=17.9 hrs, $\sigma$=0.1

Figure 12:
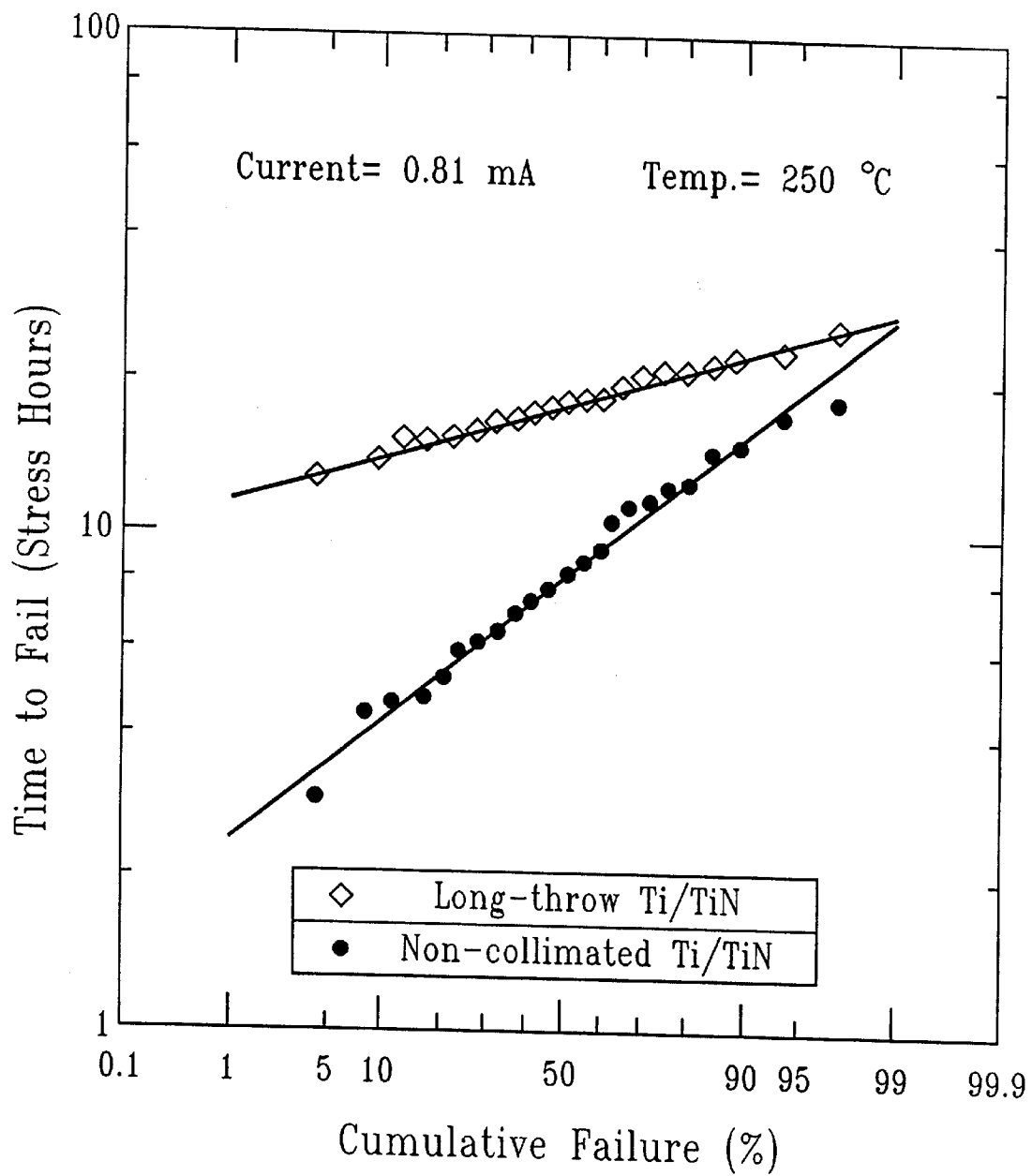
FIG. 12 is a graph comparing time to failure of fabricating according to a preferred technique of long-throw to a non-collimated technique.

FIG. 12 is a graph illustrating time to failure and shows the improved results achieved using a long-throw technique as compared to a non-collimated technique.

As apparent from the above, the samples deposited in the Ulvac tool show a two time longer lifetime, and a significantly tighter failure distribution than the samples deposited in the Endura tool.

In this disclosure there is shown and described only the preferred embodiments of the invention, but, as aforementioned, it is to be understood that the invention is capable of use in various combinations and environments and is capable of changes or modifications within the scope of the inventive concept as expressed herein.

What is claimed is:

1. A method for fabricating a metallization structure which comprises the steps of:
    a) depositing a first underlayer of a group IVA metal having a thickness of about 90 to about 110 angstroms and being <0002> fiber textured onto a substrate; and
    b) depositing a layer of at least one member selected from the group consisting of aluminum and aluminum alloys whereby said layer is in electrical contact with said underlayer, and wherein said layer is a <111> textured film.

2. The method of claim 1 wherein said depositing is chemical vapor deposition or physical vapor deposition.

3. The method of claim 1 wherein said depositing is physical vapor deposition.

4. The method of claim 1 wherein said depositing is sputter deposition.

5. The method of claim 4 wherein said sputter deposition is collimated or long throw deposition.

6. The method of claim 4 wherein said sputter deposition is long throw deposition.

7. The method of claim 1 wherein said group IVA metal is titanium.

8. The method of claim 1 wherein said aluminum alloy is an alloy of aluminum and at least one member selected from the group consisting of copper, magnesium, silicon, palladium and lanthanides.

9. The method of claim 8 wherein said alloy contains up to about 3 percent by weight of said member.

10. The method of claim 1 wherein said layer is highly textured film with a half-width on an intensity verses chi scan of less than 15 degrees and a volume fraction of less than 20 percent of random grains.

11. The method of claim 1 wherein said layer has a thickness of about 2000 to about 6000 angstroms.

12. The method of claim 1 wherein said layer has a thickness of about 2000 to about 2500 angstroms.

13. The method of claim 1 which further includes depositing a titanium nitride layer intermediate said underlayer and said layer.

14. The method of claim 13 wherein said titanium nitride layer has a thickness of about 50 to about 500 angstroms.

15. The method of claim 13 wherein said titanium nitride layer has a thickness of about 50 to about 150 angstroms.

16. The method of claim 1 which further includes depositing a capping layer located above said layer of at least one member selected from the group consisting of titanium and titanium alloys.

17. The method of claim 16 wherein said capping layer is titanium nitride or a combination of a group IVA metal layer and a titanium nitride layer.

18. The method of claim 16 wherein said capping layer is a titanium nitride or a combination of titanium layer and a titanium nitride layer.

19. The method of claim 13 which further includes a capping layer located above said layer of said at least one member selected from the group consisting of titanium and titanium alloys.

20. The method of claim 19 wherein said capping layer is titanium nitride or a combination of a group IVA metal layer and a titanium nitride layer.

21. The method of claim 19 wherein said capping layer is titanium nitride or a combination of a titanium layer and a titanium nitride layer.

22. The method of claim 1 wherein said substrate is a silicon substrate.

* * * * *